(12) United States Patent
Song et al.

(10) Patent No.: US 10,686,013 B2
(45) Date of Patent: Jun. 16, 2020

(54) MEMORY DEVICE

(71) Applicant: Samsung Electronics Co., Ltd., Suwon-si (KR)

(72) Inventors: Seul-ji Song, Yongin-si (KR); Il-mok Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/351,969

(22) Filed: Mar. 13, 2019

(65) Prior Publication Data

US 2020/0075674 A1 Mar. 5, 2020

(30) Foreign Application Priority Data

Sep. 3, 2018 (KR) .................... 10-2018-0104476

(51) Int. Cl.
*H01L 27/24* (2006.01)
*H01L 45/00* (2006.01)

(52) U.S. Cl.
CPC ...... *H01L 27/2463* (2013.01); *H01L 27/2427* (2013.01); *H01L 45/1253* (2013.01); *H01L 45/1683* (2013.01); *H01L 45/06* (2013.01); *H01L 45/124* (2013.01); *H01L 45/144* (2013.01)

(58) Field of Classification Search
CPC ............ H01L 27/2463; H01L 27/2427; H01L 45/1233; H01L 45/1253
See application file for complete search history.

(56) References Cited

U.S. PATENT DOCUMENTS

| 7,569,417 | B2 | 8/2009 | Lee et al. |
| 8,368,178 | B2 | 2/2013 | Lee |
| 8,790,976 | B2 | 7/2014 | Oh et al. |
| 9,166,158 | B2 | 10/2015 | Lengade et al. |
| 9,466,644 | B2 | 10/2016 | Matamis et al. |
| 9,515,260 | B2 | 12/2016 | Kim et al. |
| 9,887,354 | B2 | 2/2018 | Jeong et al. |
| 10,297,642 | B2 * | 5/2019 | Terai ............ H01L 27/249 |
| 10,403,817 | B2 * | 9/2019 | Song ............ H01L 27/2427 |
| 10,461,127 | B2 * | 10/2019 | Park ............ H01L 45/1675 |

(Continued)

FOREIGN PATENT DOCUMENTS

| KR | 10-1038993 A | 6/2011 |
| KR | 10-2016-0039228 A | 4/2016 |
| KR | 10-2016-0123067 A | 10/2016 |

*Primary Examiner* — Allison Bernstein
(74) *Attorney, Agent, or Firm* — Muir Patent Law, PLLC

(57) ABSTRACT

A memory device includes a lower conductive line, a first memory unit, a second memory unit, and a shared lower electrode including first and second portions electrically connecting respective ones of the first memory unit and the second memory unit to the lower conductive line. A first insulating region is disposed between the first and second memory units. A second insulating region is disposed on the first insulating region. The device further includes a first switch unit on the first memory unit and including an upper electrode with a portion protruding from the second insulating region and a second switch unit on the second memory unit and including an upper electrode with a portion protruding from the second insulating region. First and second upper conductive lines contact the protruding portions of the respective upper electrodes.

20 Claims, 27 Drawing Sheets

(56) References Cited

U.S. PATENT DOCUMENTS

2015/0028280 A1   1/2015  Sciarrillo et al.
2018/0040809 A1   2/2018  Moon
2019/0067569 A1*  2/2019  Kang .................. H01L 27/2463

* cited by examiner

MEMORY DEVICE

CROSS-REFERENCE TO RELATED APPLICATION

This application claims the benefit of Korean Patent Application No. 10-2018-0104476, filed on Sep. 3, 2018, in the Korean Intellectual Property Office, the disclosure of which is incorporated herein in its entirety by reference.

BACKGROUND

The inventive concept relates to memory devices, and more particularly, to phase-change random-access memory (PRAM) devices.

PRAM is a type of nonvolatile memory that stores data by changing a phase of a material. A memory cell of PRAM device may include a memory unit including a phase-change material and a switch unit for selecting the memory unit. The memory cell may be connected to an upper conductive line and a lower conductive line (e.g., a bit line and a word line).

SUMMARY

Embodiments of the inventive concept may provide memory devices with reduced contact resistance between a switch unit of a memory cell and an upper conductive line and/or reduced contact resistance between a memory unit and the switch unit.

According to an aspect of the inventive concept, a memory device includes a lower conductive line, a first memory unit, a second memory unit, and a shared lower electrode including first and second portions electrically connecting respective ones of the first memory unit and the second memory unit to the lower conductive line. The device also includes a first insulating region on the first portion of the shared lower electrode between the first and second memory units and a second insulating region on the first insulating region. The device further includes a first switch unit on the first memory unit in the second insulating region and including an upper electrode with a portion protruding from the second insulating region and a second switch unit on the second memory unit in the second insulating region and including an upper electrode with a portion protruding from the second insulating region. A first upper conductive line contacts the protruding portion of the upper electrode of the first switch unit and a second upper conductive line contacts the protruding portion of the upper electrode of the second switch unit. The first upper conductive line may contact a pair of sidewalls of the protruding portion of the upper electrode of the first switch unit and the second conductive line may contact a pair of sidewalls of the protruding portion of the upper electrode of the second switch unit.

According to another aspect of the inventive concept, a memory device includes a lower conductive line and a lower electrode including a first portion on the lower conductive line and second and third portions extending vertically from respective first and second ends of the first portion of the lower electrode. A first memory pattern is disposed on an end of the second portion of the lower electrode and a second memory pattern is disposed on an end of the third portion of the lower electrode. The device also includes a first insulating region between the second and third portions of the lower electrode and between the first and second memory patterns. A first upper intermediate electrode, a first switch pattern, and a first upper electrode are stacked on the first insulating region and a second upper intermediate electrode, a second switch pattern, and a second upper electrode are stacked on the first insulating region. The device further includes a first lower intermediate electrode on the first memory pattern and including a portion protruding into the first upper intermediate electrode and a second lower intermediate electrode on the second memory pattern and including a portion protruding into the second upper intermediate electrode. A second insulating region is disposed on the first insulating region and surrounds the first upper intermediate electrode, the first switch pattern, the first upper electrode, the second upper intermediate electrode, the second switch pattern, and the second upper electrode. A first upper conductive line contacts the first upper electrode and a second upper conductive line contacts the second upper electrode.

According to another aspect of the inventive concept, there is provided a memory device including: a lower conductive line extending in a first direction; a first lower insulating pattern and a second lower insulating pattern located on the lower conductive line and spaced apart from each other in the first direction; a filling insulating pattern located between the first lower insulating pattern and the second lower insulating pattern; a lower electrode including a first portion located between the lower conductive line and the filling insulating pattern, a second portion located between the first lower insulating pattern and the filling insulating pattern, and a third portion located between the second lower insulating pattern and the filling insulating pattern; a spacer located between the lower electrode and the filling insulating pattern; a first memory pattern located on an end of the lower electrode and an end of the spacer and extending along the first lower insulating pattern; a second memory pattern located on the other end of the lower electrode and the other end of the spacer and extending along the second lower insulating pattern; a first lower intermediate electrode located on the first memory pattern and extending along the first lower insulating pattern; a second lower intermediate electrode located on the second memory pattern and extending along the second lower insulating pattern; a first upper intermediate electrode, a first switch pattern and a first upper electrode sequentially stacked on the first lower intermediate electrode; a second upper intermediate electrode, a second switch pattern, and a second upper electrode sequentially stacked on the second lower intermediate electrode; an upper insulating pattern located on the first lower insulating pattern and the second lower insulating pattern and surrounding the first upper intermediate electrode, the first switch pattern, the first upper electrode, the second upper intermediate electrode, the second switch pattern, and the second upper electrode; a first upper conductive line contacting the first upper electrode and extending in a second direction; and a second upper conductive line contacting the second upper electrode and extending in the second direction, wherein each of the first upper electrode and the second upper electrode includes a buried portion surrounded by the upper insulating pattern and a protruding portion protruding from the upper insulating pattern.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
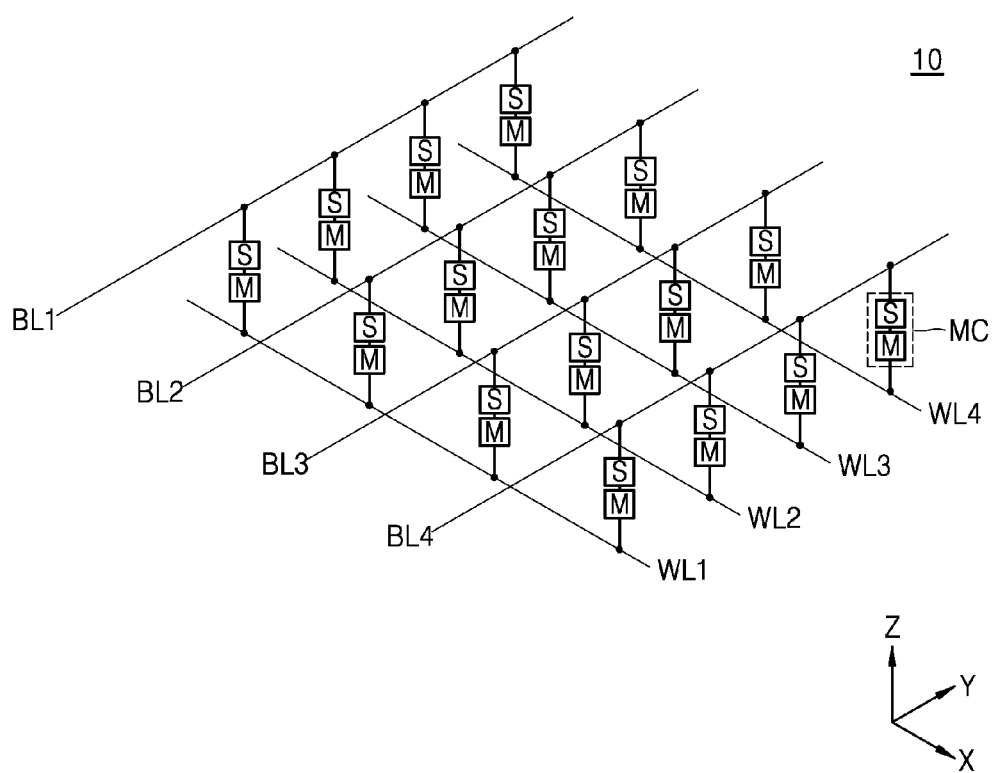
FIG. 1 is a circuit diagram of a memory device according to some embodiments.

FIG. 1 is a circuit diagram of a memory device 10 according to some embodiments. Referring to FIG. 1, the memory device 10 may include word lines WL1 through WL4 extending in a first direction X and spaced apart from one another in a second direction Y perpendicular to the first direction X, and bit lines BL1 through BL4 extending in the second direction Y and spaced apart from one another in the first direction X.

The memory device 10 may include a plurality of memory cells MC. Each of the memory cells MC may be located between adjacent ones of the word lines WL1 through WL4 and adjacent ones of the bit lines BL1 through BL4. Each memory cell MC may include a memory unit M for storing data and a switch unit S for selecting the memory unit M. The memory unit M and the switch unit S may be connected in series. In some embodiments, as shown in FIG. 1, the memory unit M may be connected to one of the plurality of word lines WL1 through WL4 and the switch unit S may be connected to one of the plurality of bit lines BL1 through BL4. In some embodiments, unlike FIG. 1, the memory unit M may be connected to one of the plurality of bit lines BL1 through BL4 and the switch unit S may be connected to one of the plurality of word lines WL1 through WL4.

Figure 2A:
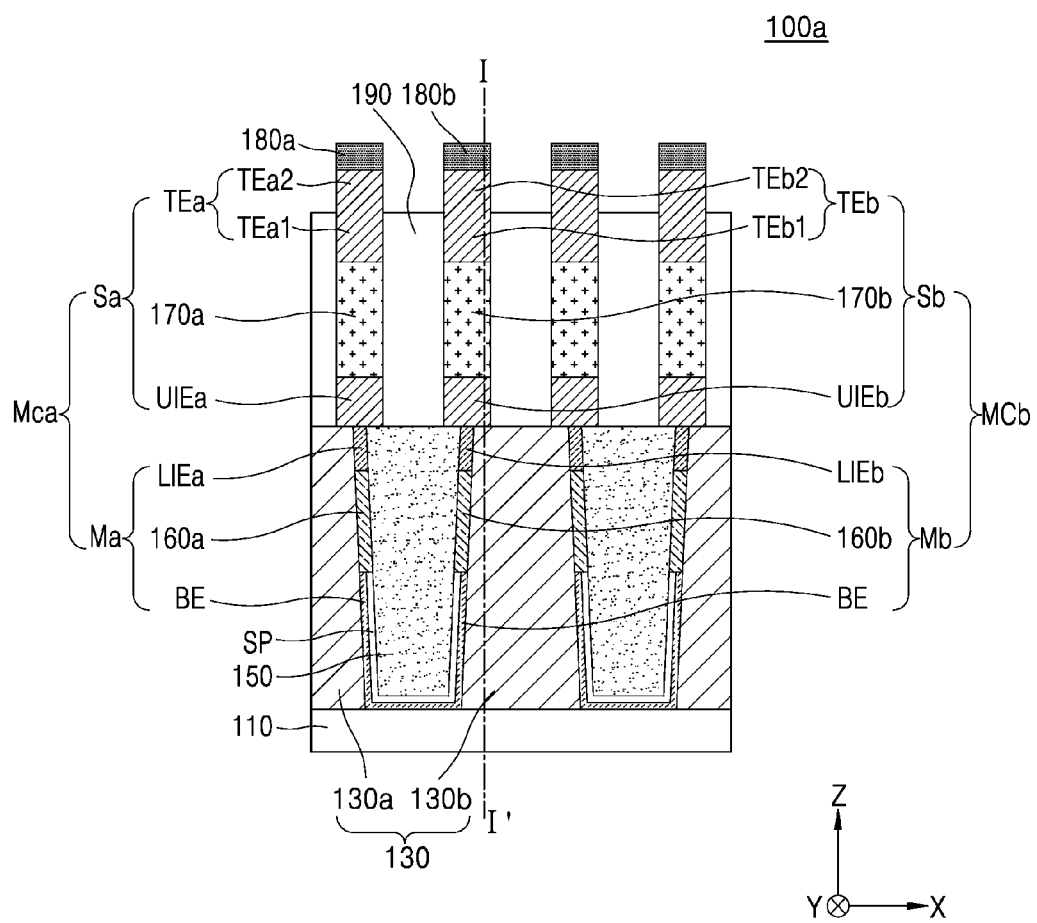
FIG. 2A is a cross-sectional view of a memory device according to some embodiments.
Figure 2B:
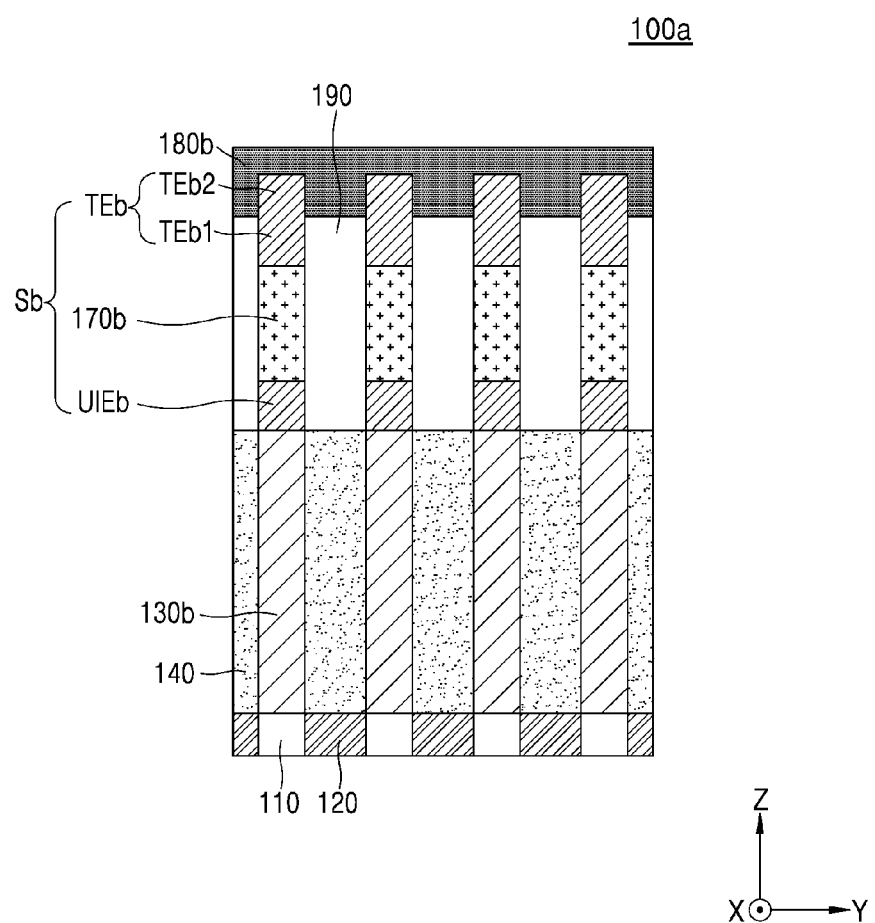
FIG. 2B is a cross-sectional view taken along line I-I' of FIG. 2A.

FIG. 2A is a cross-sectional view of a memory device 100a according to some embodiments. FIG. 2B is a cross-sectional view taken along line I-I' of FIG. 2A.

Referring to FIGS. 2A and 2B, the memory device 100a may include a plurality of lower conductive lines 110 each extending in the first direction X and a plurality of upper conductive lines each extending in the second direction Y. The plurality of upper conductive lines may include a plurality of first upper conductive lines 180a and a plurality of second upper conductive lines 180b that are alternately arranged.

In some embodiments, the plurality of lower conductive lines 110 may correspond to the plurality of word lines WL1 through WL4 of FIG. 1, and the first and second upper conductive lines 180a and 180b may correspond to the plurality of bit lines BL1 through BL4 of FIG. 1. In other embodiments, the plurality of lower conductive lines 110 may correspond to the plurality of bit lines BL1 through BL4 of FIG. 1, and the first and second upper conductive lines 180a and 180b may correspond to the plurality of word lines WL1 through WL4 of FIG. 1.

Each of the plurality of lower conductive lines 110 and the first and second upper conductive lines 180a and 180b may include a metal, conductive metal nitride, conductive metal oxide, or a combination thereof. Each of the plurality of lower conductive lines 110 and the first and second upper conductive lines 180a and 180b may include tungsten (W), titanium (Ti), tantalum (Ta), aluminum (Al), copper (Cu), carbon (C), CN, TiN, TiAlN, TiSiN, TiCN, TiCSiN, WN, CoSiN, WSiN, TaN, TaCN, TaSiN, gold (Au), silver (Ag), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof.

Spaces between adjacent ones of the lower conductive lines 110 may be filled with a first interlayer insulating pattern 120. The first interlayer insulating pattern 120 may include silicon oxide, silicon nitride, or a combination thereof.

A first memory cell MCa may be located between each of the lower conductive lines 110 and each of the first upper conductive lines 180a, and a second memory cell MCb may be located between each of the lower conductive lines 110 and each of the second upper conductive lines 180b. The first memory cell MCa may include a first memory unit Ma contacting the lower conductive line 110 and a first switch unit Sa located between the first memory unit Ma and the first upper conductive line 180a. The second memory cell MCb may include a second memory unit Mb contacting the lower conductive line 110 and a second switch unit Sb located between the second memory unit Mb and the second upper conductive line 180b.

A plurality of lower insulating patterns 130 may be located on the plurality of lower conductive lines 110 and the first interlayer insulating patterns 120. Each of the lower insulating patterns 130 may extend in the second direction Y. In some embodiments, a side surface of each of the lower insulating patterns 130 may be inclined with respect to a third direction Z perpendicular to the first direction X and the second direction Y. Each of the lower insulating patterns 130 may include silicon oxide, silicon nitride, or a combination thereof.

The plurality of lower insulating patterns 130 may include a plurality of first lower insulating patterns 130a and a plurality of second lower insulating patterns 130b that are alternately arranged. Each of the first lower insulating patterns 130a and each of the second lower insulating patterns 130b may be spaced apart from each other in the first direction X. The plurality of first lower insulating patterns 130a may be spaced apart from one another in the first direction X and the second direction Y. The plurality of second lower insulating patterns 130b may be spaced apart from one another in the first direction X and the second direction Y.

A filling insulating pattern 150 may be located between each of the first lower insulating patterns 130a and each of the second lower insulating patterns 130b. The first memory unit Ma may be located between the filling insulating pattern 150 and the first lower insulating pattern 130a, and the second memory unit Mb may be located between the filling insulating pattern 150 and the second lower insulating pattern 130b. The filling insulating pattern 150 may include silicon oxide, silicon nitride, or a combination thereof.

A second interlayer insulating pattern 140 may be located between the plurality of first lower insulating patterns 130a that are spaced apart from each other in the second direction Y and the plurality of second lower insulating patterns 130b that are spaced apart from each other in the second direction Y. The second interlayer insulating pattern 140 may include silicon oxide, silicon nitride, or a combination thereof.

The first memory unit Ma may contact the first lower insulating pattern 130a and the filling insulating pattern 150, and the second memory unit Mb may contact the second lower insulating pattern 130b and the filling insulating pattern 150. The first memory unit Ma may include a lower electrode BE, a first memory pattern 160a, and a first lower intermediate electrode LIEa. The second memory unit Mb may include the lower electrode BE, a second memory pattern 160b, and a second lower intermediate electrode LIEb.

The lower electrode BE may be shared by the first memory unit Ma and the second memory unit Mb. The lower electrode BE may include a first portion contacting the lower conductive line 110, a second portion contacting the first lower insulating pattern 130a, and a third portion contacting the second lower insulating pattern 130b. The first portion of the lower electrode BE may be located between the lower conductive line 110 and the filling insulating pattern 150. The second portion of the lower electrode BE may be located between the first lower insulating pattern 130a and the filling insulating pattern 150. The third portion of the lower electrode BE may be located between the second lower insulating pattern 130b and the filling insulating pattern 150. In some embodiments, the second portion and the third portion of the lower electrode BE may be inclined with respect to the third direction Z.

The lower electrode BE may include a metal, metal nitride, a carbon-based conductive material, or a combination thereof. For example, the lower electrode BE may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof.

A spacer SP may be located between the lower electrode BE and the filling insulating pattern 150. The spacer SP may be located on the lower electrode BE and may extend along the lower electrode BE. The spacer SP may include silicon nitride, silicon oxide, or a combination thereof.

The first memory pattern 160a may be located on an end of the lower electrode BE and an end of the spacer SP, and may extend on a side wall of the first lower insulating pattern 130a. The first memory pattern 160a may be located between the first lower insulating pattern 130a and the filling insulating pattern 150. The second memory pattern 160b may be located on the other end of the lower electrode BE and the other end of the spacer S, and may extend on a side wall of the second lower insulating pattern 130b. The second memory pattern 160b may be located between the second lower insulating pattern 130b and the filling insulating pattern 150. In some embodiments, the first memory pattern 160a and the second memory pattern 160b may be inclined with respect to the third direction Z.

Each of the first memory pattern 160a and the second memory pattern 160b may include a phase-change material. In some embodiments, the first memory pattern 160a and the second memory pattern 160b may include a chalcogenide material such as Ge—Sb—Te (GST).

The first lower intermediate electrode LIEa may be located on the first memory pattern 160a and may extend on a side wall of the first lower insulating pattern 130a. The first lower intermediate electrode LIEa may be located between the first lower insulating pattern 130a and the filling insulating pattern 150. The second lower intermediate electrode LIEb may be located on the second memory pattern 160b and may extend on a side wall of the second lower insulating pattern 130b. The second lower intermediate electrode LIEb may be located between the second lower insulating pattern 130b and the filling insulating pattern 150. In some embodiments, the first lower intermediate electrode LIEa and the second lower intermediate electrode LIEb may be inclined with respect to the third direction Z.

Each of the first lower intermediate electrode LIEa and the second lower intermediate electrode LIEb may include a metal, metal nitride, a carbon-based conductive material, or a combination thereof. For example, each of the first lower intermediate electrode LIEa and the second lower intermediate electrode LIEb may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof.

The first switch unit Sa may include a first upper intermediate electrode UIEa, a first switch pattern 170a, and a first upper electrode TEa that are sequentially stacked. The second switch unit Sb may include a second upper intermediate electrode UIEb, a second switch pattern 170b, and a second upper electrode TEb that are sequentially stacked.

The first switch unit Sa and the second switch unit Sb may be surrounded by an upper insulating pattern 190. However, at least a part of the first switch unit Sa and at least a part of the second switch unit Sb may protrude from the upper insulating pattern 190. The upper insulating pattern 190 may include silicon nitride, silicon oxide, or a combination thereof.

The first upper intermediate electrode UIEa may be located on the first lower intermediate electrode LIEa, and the second upper intermediate electrode UIEb may be located on the second lower intermediate electrode LIEb. Each of the first upper intermediate electrode UIEa and the second upper intermediate electrode UIEb may include a metal, metal nitride, a carbon-based conductive material, or a combination thereof. For example, each of the first upper intermediate electrode UIEa and the second upper intermediate electrode UIEb may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof. The first upper intermediate electrode UIEa and the second upper intermediate electrode UIEb may include materials different from materials of the first lower intermediate electrode LIEa and the second lower intermediate electrode LIEb. For example, each of the first lower intermediate electrode LIEa and the second lower intermediate electrode LIEb may include metal nitride, and each of the first upper intermediate electrode UIEa and the second upper intermediate electrode UIEb may include a carbon-based conductive material.

The first switch pattern 170a may be located on the first upper intermediate electrode UIEa, and the second switch pattern 170b may be located on the second upper intermediate electrode UIEb. Each of the first switch pattern 170a and the second switch pattern 170b may include a chalcogenide switching material. For example, each of the first switch pattern 170a and the second switch pattern 170b may include an ovonic threshold switching (OTS) material.

The first upper electrode TEa may be located on the first switch pattern 170a, and the second upper electrode TEb may be located on the second switch pattern 170b. The first upper electrode TEa may include a buried portion TEa1 surrounded by the upper insulating pattern 190 and a protruding portion TEa2 protruding from the upper insulating pattern 190. The second upper electrode TEb may include a buried portion TEb1 surrounded by the upper insulating pattern 190 and a protruding portion TEb2 protruding from the upper insulating pattern 190.

Since the first upper electrode TEa includes the protruding portion TEa2, the first upper conductive line 180a may contact not only a top surface of the protruding portion TEa2 of the first upper electrode TEa but also a pair of side surfaces of the protruding portion TEa2 of the first upper electrode TEa that are spaced apart from each other in the second direction Y. Since the second upper electrode TEb includes the protruding portion TEb2, the second upper conductive line 180b may contact not only a top surface of the protruding portion TEb2 of the second upper electrode TEb but also a pair of side surfaces of the protruding portion TEb2 of the second upper electrode TEb that are spaced apart from each other in the second direction Y. Accordingly, contact area between the first electrode TEa and the first upper conductive line 180a and contact area between the second upper electrode TEb and the second upper conductive line 180b may increase, and contact resistance between the first upper electrode TEa and the first upper conductive line 180a and contact resistance between the second upper electrode TEb and the second upper conductive line 180b may decrease.

Each of the first upper electrode TEa and the second upper electrode TEb may include a metal, metal nitride, a carbon-based conductive material, or a combination thereof. For example, each of the first upper electrode TEa and the second upper electrode TEb may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof.

Figure 3:
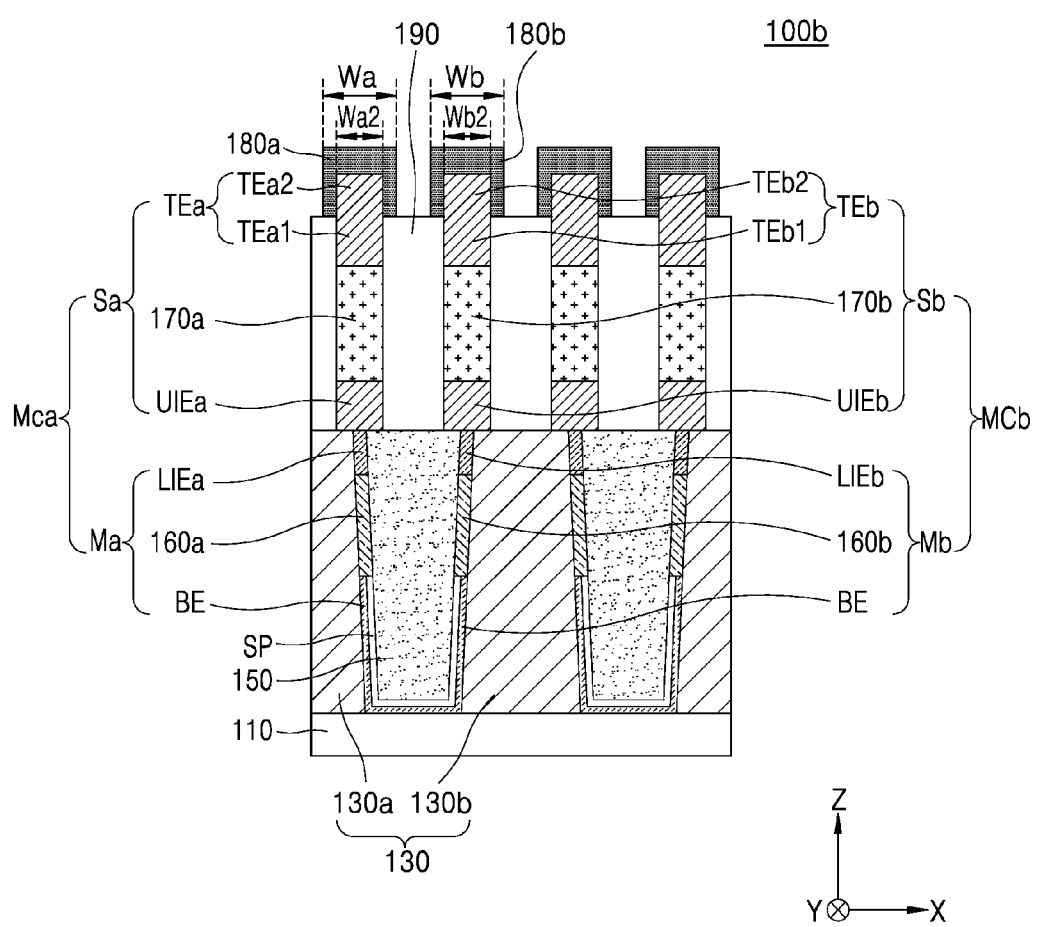
FIG. 3 is a cross-sectional view of a memory device according to some embodiments.

FIG. 3 is a cross-sectional view of a memory device 100b according to some embodiments. The following will focus on a difference between the memory device 100a of FIGS. 2A and 2B and the memory device 100b of FIG. 3.

Referring to FIG. 3, a width Wa of the first upper conductive line 180a in the first direction X may be greater than a width Wa2 of the protruding portion TEa2 of the first upper electrode TEa in the first direction X. A width Wb of the second upper conductive line 180b in the first direction X may be greater than a width Wb2 of the protruding portion TEb2 of the second upper electrode TEb in the first direction X. Accordingly, the first upper conductive line 180a may further contact another pair of side surfaces of the protruding portion TEa2 of the first upper electrode TEa that are spaced apart from each other in the first direction X, and the second upper conductive line 180b may further contact another pair of side surfaces of the protruding portion TEb2 of the second upper electrode TEb that are spaced apart from each other in the first direction X. Accordingly, contact area between the first upper conductive line 180a and the first upper electrode TEa and contact area between the second upper conductive line 180b and the second upper electrode TEb may increase, and contact resistance between the first upper conductive line 180a and the first upper electrode TEa and contact resistance between the second upper conductive line 180b and the second upper electrode TEb may decrease.

Figure 4A:
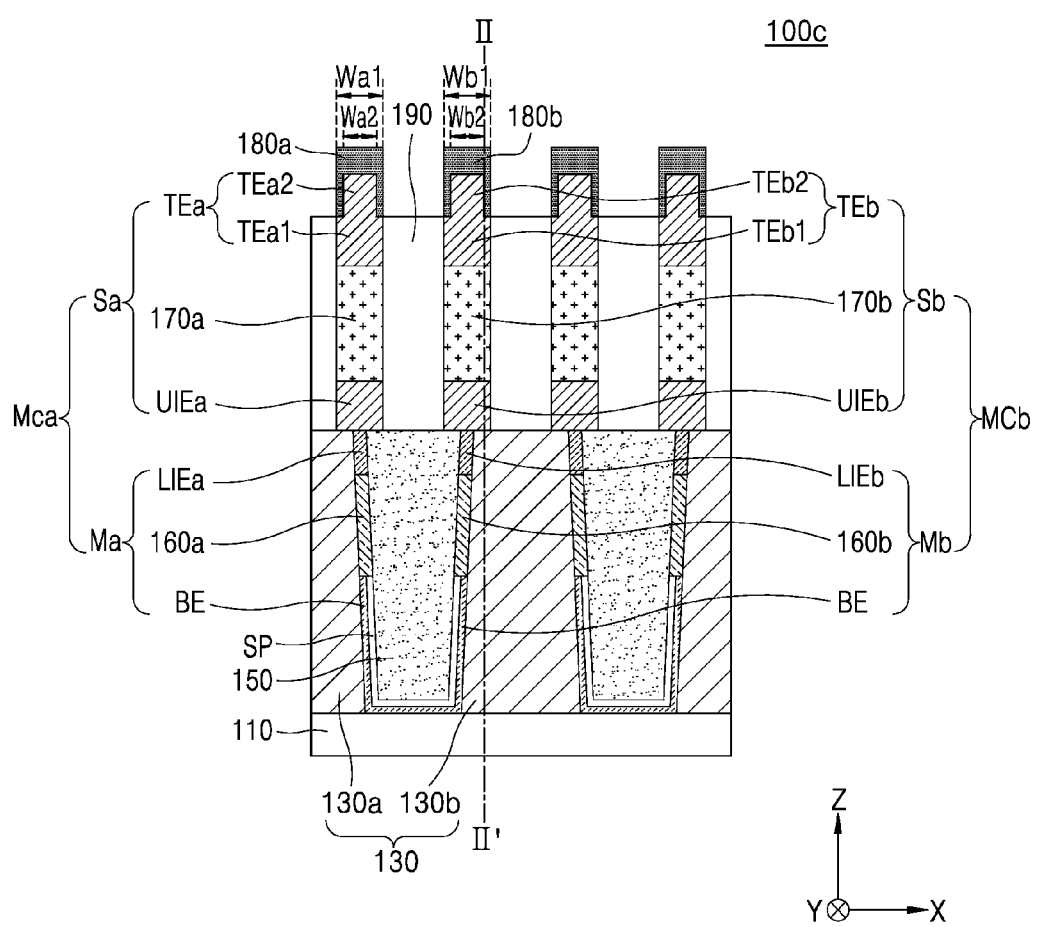
FIG. 4A is a cross-sectional view of a memory device according to some embodiments.
Figure 4B:
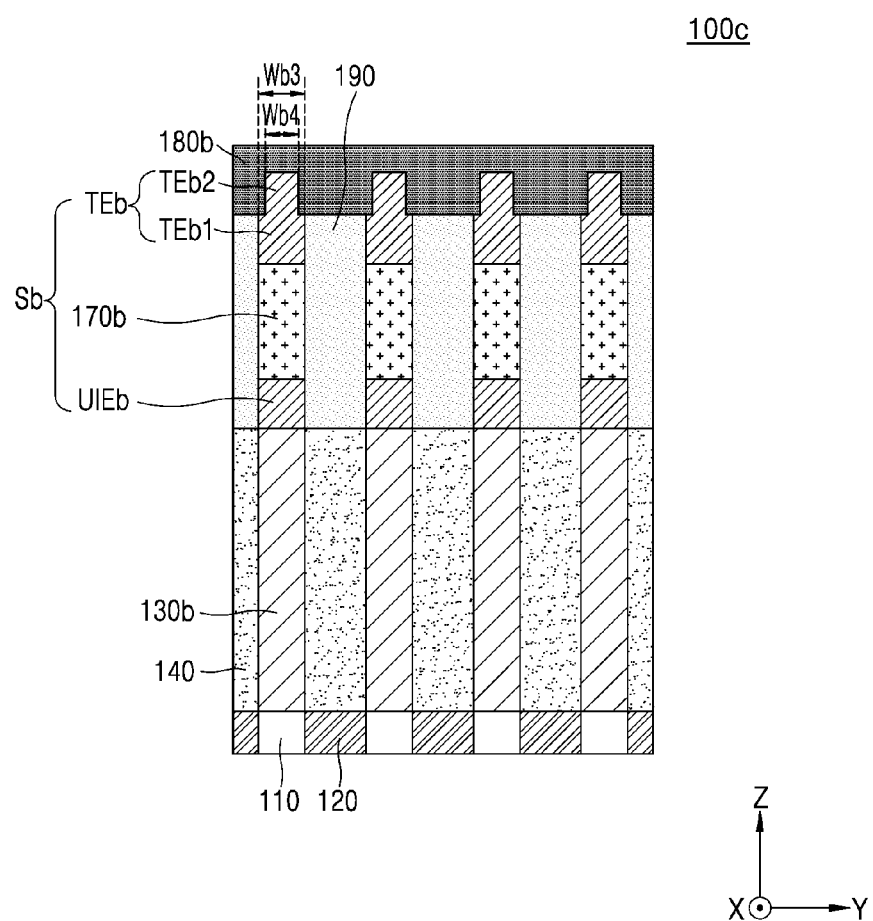
FIG. 4B is a cross-sectional view taken along line II-II' of FIG. 4A.

FIG. 4A is a cross-sectional view of a memory device 100c according to some embodiments. FIG. 4B is a cross-sectional view taken along line II-II' of FIG. 4A. The following will focus on a difference between the memory device 100b of FIG. 3 and the memory device 100c of FIGS. 4A and 4B.

Referring to FIGS. 4A and 4B, the width Wa2 of the protruding portion TEa2 of the first upper electrode TEa in the first direction X may be less than a width Wa1 of the buried portion TEa1 of the first upper electrode TEa in the first direction X. The width Wb2 of the protruding portion TEb2 of the second upper electrode TEb may be less than a width Wb1 of the buried portion TEb1 of the second upper electrode TEb in the first direction X.

A width Wb4 of the protruding portion TEb2 of the second upper electrode TEb in the second direction Y may be less than a width Wb3 of the buried portion TEb1 of the second upper electrode TEb in the second direction Y. Although not shown, a width of the protruding portion TEa2 of the first upper electrode TEa in the second direction Y may be less than a width of the buried portion TEa1 of the first upper electrode TEa in the second direction Y.

Figure 5A:
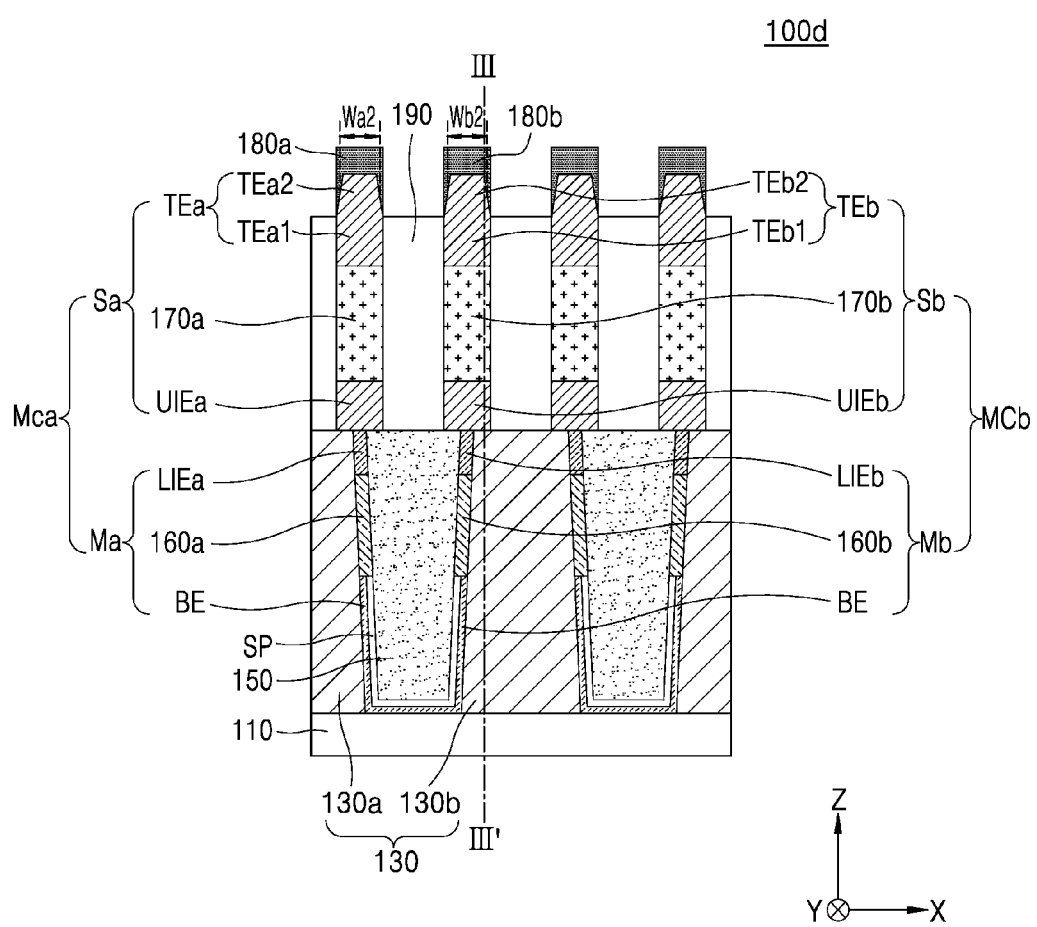
FIG. 5A is a cross-sectional view of a memory device according to some embodiments.
Figure 5B:
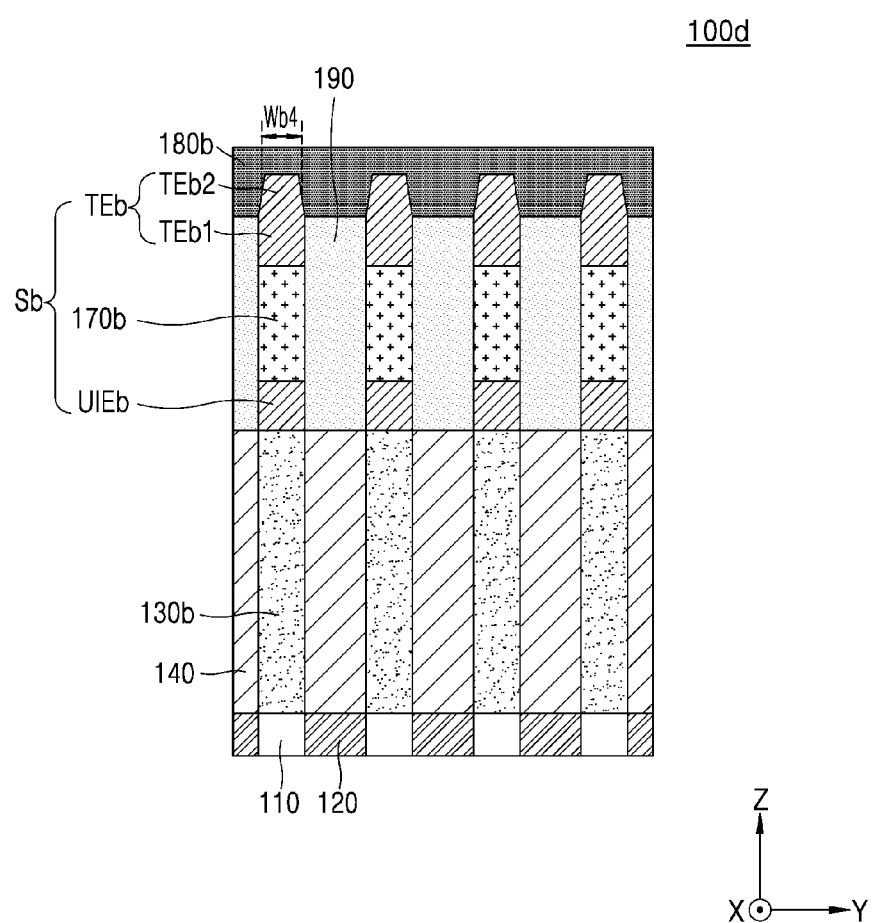
FIG. 5B is a cross-sectional view taken along line III-III' of FIG. 5A.

FIG. 5A is a cross-sectional view of a memory device 100d according to some embodiments. FIG. 5B is a cross-sectional view taken along line of FIG. 5A. The following will focus on a difference between the memory device 100a of FIGS. 2A and 2B and the memory device 100d of FIGS. 5A and 5B.

Referring to FIGS. 5A and 5B, the width Wa2 of the protruding portion TEa2 of the first upper electrode TEa in the first direction X may increase toward the buried portion TEa1 of the first upper electrode TEa. The width Wb2 of the protruding portion TEb2 of the second upper electrode TEb in the first direction X may increase toward the buried portion TEb1 of the second upper electrode TEb.

The width Wb4 of the protruding portion TEb2 of the second upper electrode TEb in the second direction Y may increase toward the buried portion TEb1 of the second upper electrode TEb. Although not shown, the width of the protruding portion TEa2 of the first upper electrode TEa in the second direction Y may increase toward the buried portion TEa1 of the first upper electrode TEa.

Figure 6A:
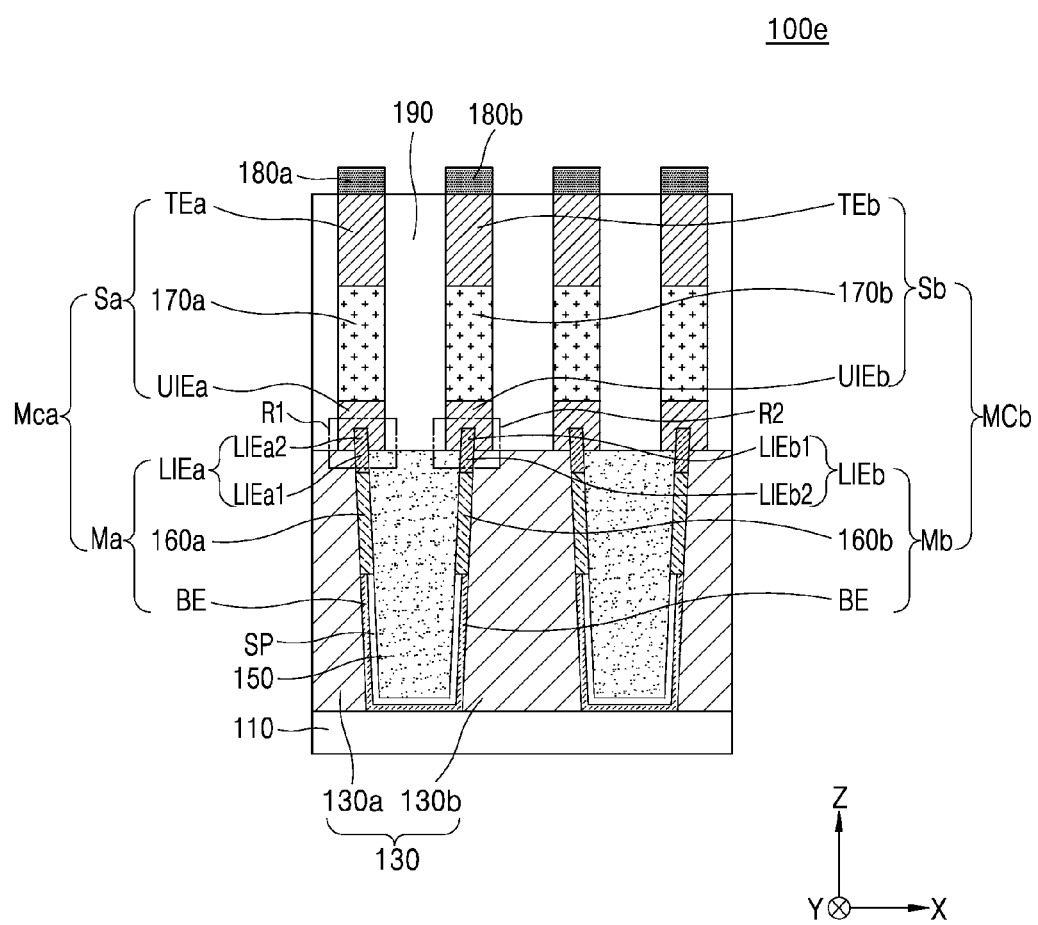
FIG. 6A is a cross-sectional view of a memory device according to some embodiments.
Figure 6B:
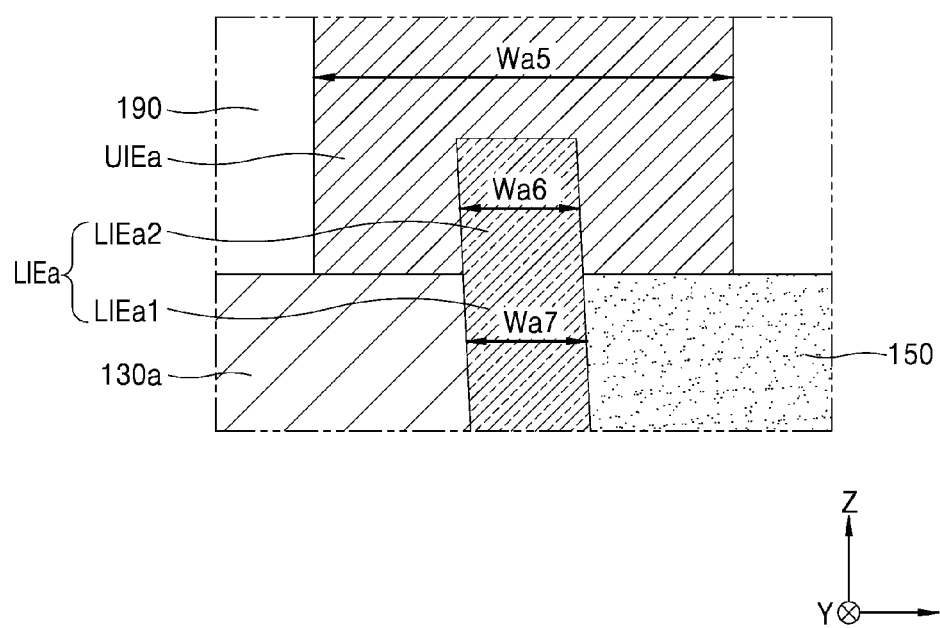
FIG. 6B is an enlarged view illustrating a region R1 of FIG. 6A.
Figure 6C:
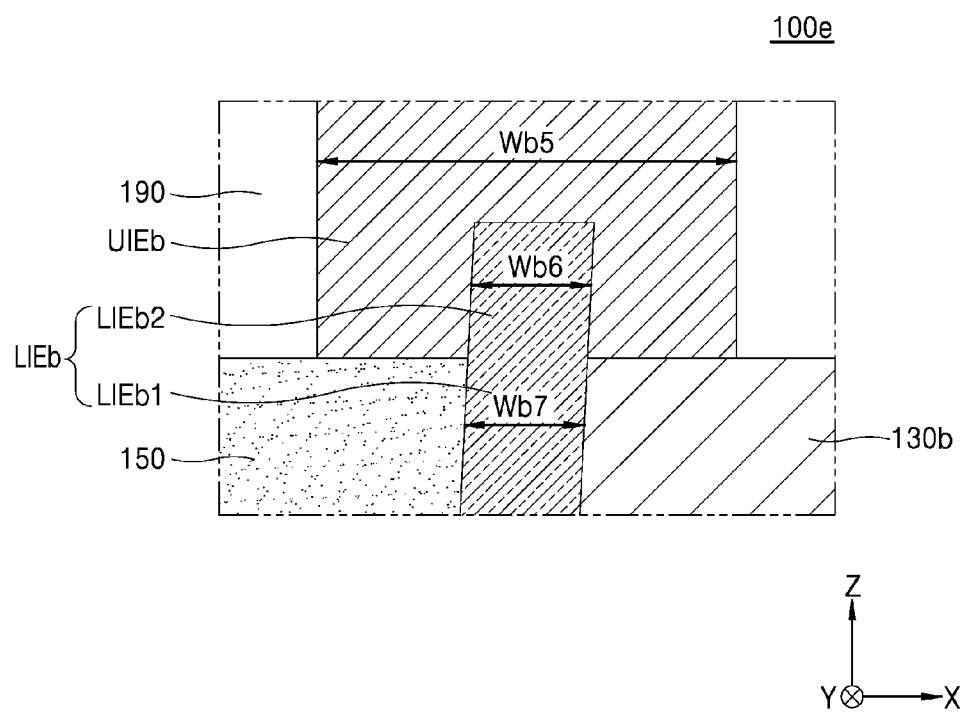
FIG. 6C is an enlarged view illustrating a region R2 of FIG. 6A.

FIG. 6A is a cross-sectional view of a memory device 100e according to some embodiments. FIG. 6B is an enlarged view illustrating a region R1 of FIG. 6A. FIG. 6C is an enlarged view illustrating a region R2 of FIG. 6A. The following will focus on a difference between the memory device 100a of FIGS. 2A and 2B and the memory device 100e of FIGS. 6A through 6C.

Referring to FIGS. 6A through 6C, at least a part of the first memory unit Ma may protrude from the first lower insulating pattern 130a and the filling insulating pattern 150, and at least a part of the second memory unit Mb may protrude from the second lower insulating pattern 130b and the filling insulating pattern 150. The first lower intermediate electrode LIEa may include a buried portion LIEa1 located between the first lower insulating pattern 130a and the filling insulating pattern 150, and a protruding portion LIEa2 protruding from the first lower insulating pattern 130a and the filling insulating pattern 150. The second lower intermediate electrode LIEb may include a buried portion LIEb1 located between the second lower insulating pattern 130b and the filling insulating pattern 150, and a protruding portion LIEb2 protruding from the second lower insulating pattern 130b and the filling insulating pattern 150. The protruding portion LIEa2 of the first lower intermediate electrode LIEa may be surrounded by the first upper intermediate electrode UIEa. The protruding portion LIEb2 of the second lower intermediate electrode LIEb may be surrounded by the second upper intermediate electrode UIEb.

Since the first lower intermediate electrode LIEa includes the protruding portion LIEa2 and the second lower intermediate electrode LIEb includes the protruding portion LIEb2, contact area between the first lower intermediate electrode LIEa and the first upper intermediate electrode UIEa and contact area between the second lower intermediate electrode LIEb and the second upper intermediate electrode UIEb may increase. Accordingly, contact resistance between the first lower intermediate electrode LIEa and the first upper intermediate electrode UIEa and contact resistance between the second lower intermediate electrode LIEb and the second upper intermediate electrode UIEb may decrease.

A width Wa6 of the protruding portion LIEa2 of the first lower intermediate electrode LIEa in the first direction X and a width Wa7 of the buried portion LIEa1 of the first lower intermediate electrode LIEa in the first direction X may be less than a width Wa5 of the first upper intermediate electrode UIEa in the first direction X. A width Wb6 of the protruding portion LIEb2 of the second lower intermediate electrode LIEb in the first direction X and a width Wb7 of the buried portion LIEb1 of the second lower intermediate electrode LIEb in the first direction X may be less than a width Wb5 of the second upper intermediate electrode UIEb in the first direction X.

In some embodiments, the first upper electrode TEa and the second upper electrode TEb may not protrude from the upper insulating pattern 190. However, in some embodiments, unlike in FIG. 6A, at least a part of the first upper electrode TEa and at least a part of the second upper electrode TEb may protrude from the upper insulating pattern 190.

In some embodiments, the buried portion LIEa1 and the protruding portion LIEa2 of the first lower intermediate electrode LIEa may be inclined with respect to the third direction Z. In some embodiments, the buried portion LIEb1 and the protruding portion LIEb2 of the second lower intermediate electrode LIEb may be inclined with respect to the third direction Z.

Figure 7A:
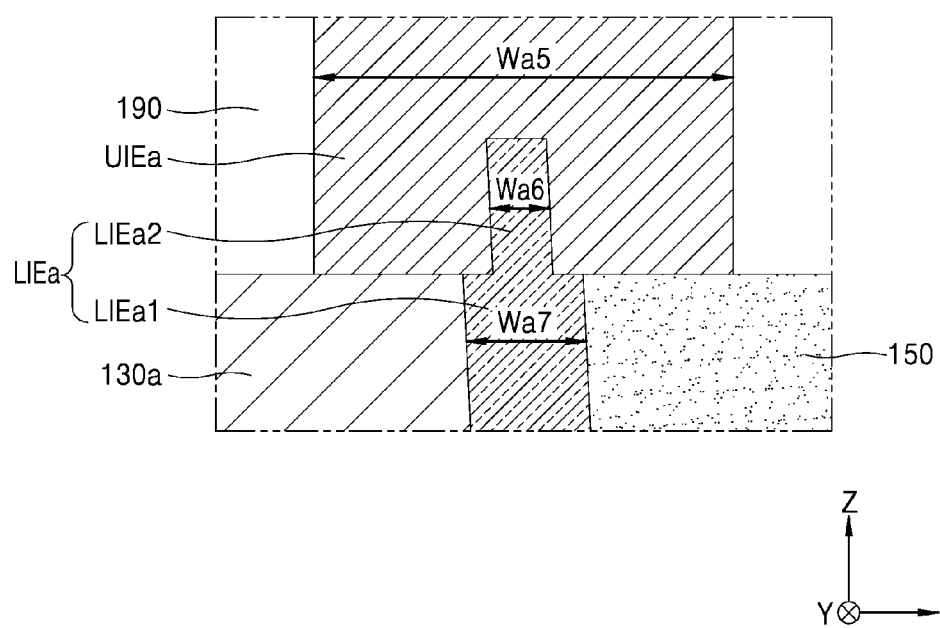
FIGS. 7A and 7B are enlarged views of a memory device according to some embodiments.
Figure 7B:
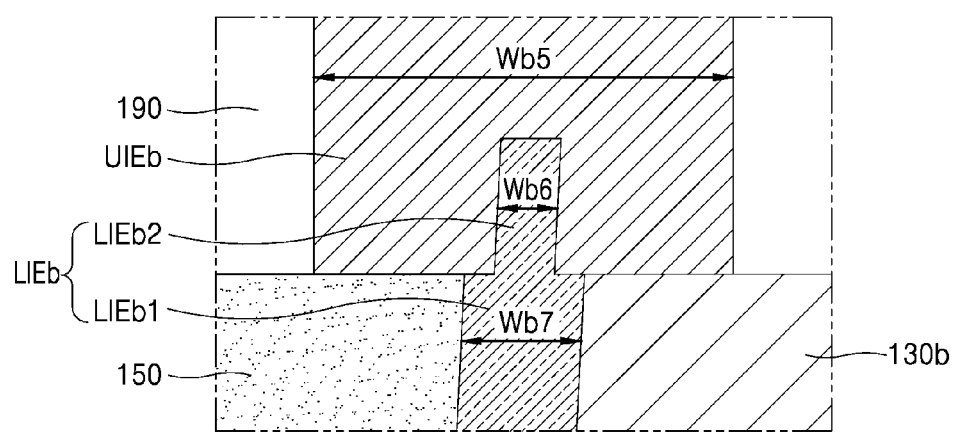

FIGS. 7A and 7B are enlarged views of a memory device 100f according to some embodiments. The following will focus on a difference between the memory device 100e of FIGS. 6A through 6C and the memory device 100f of FIGS. 7A and 7B.

Referring to FIGS. 7A and 7B, the width Wa6 of the protruding portion LIEa2 of the first lower intermediate electrode LIEa in the first direction X may be less than the width Wa1 of the buried portion LIEa1 of the first lower intermediate electrode LIEa in the first direction X. The width Wb6 of the protruding portion LIEb2 of the second lower intermediate electrode LIEb in the first direction X may be less than the width Wb7 of the buried portion LIEb1 of the second lower intermediate electrode LIEb in the first direction X.

Figure 8A:
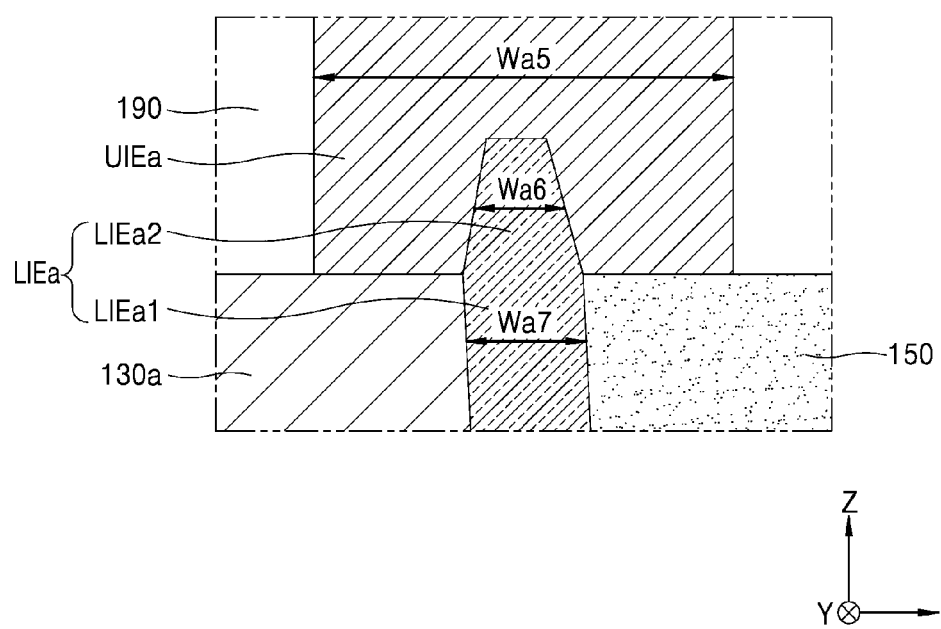
FIGS. 8A and 8B are enlarged views of a memory device according to some embodiments.
Figure 8B:
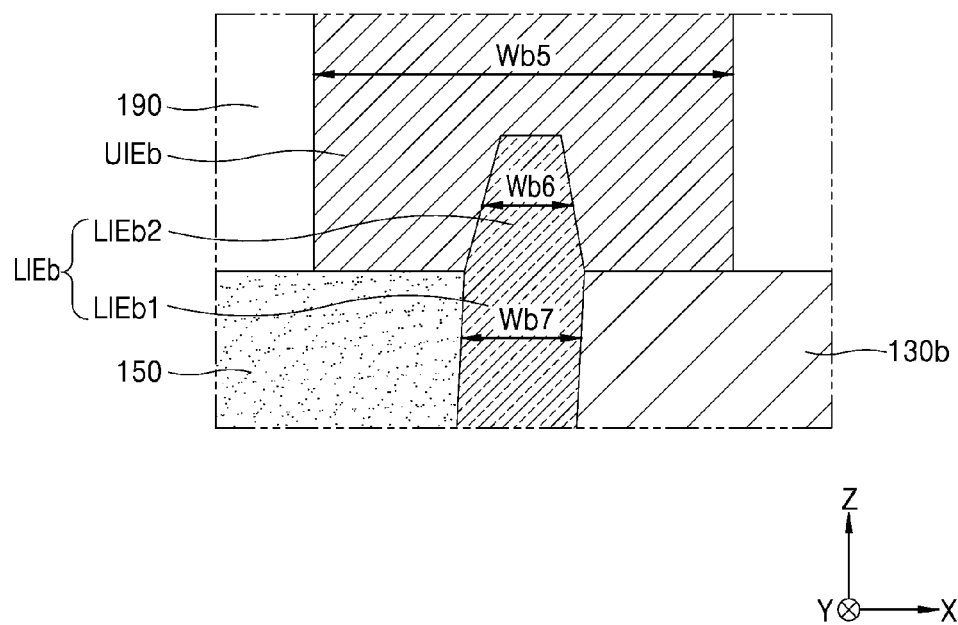

FIGS. 8A and 8B are enlarged views of a memory device 100g according to some embodiments. The following will focus on a difference between the memory device 100e of FIGS. 6A through 6C and the memory device 100g of FIGS. 8A and 8B.

Referring to FIGS. 8A and 8B, the width Wa6 of the protruding portion LIEa2 of the first lower intermediate electrode LIEa in the first direction X may increase toward the buried portion LIEa1 of the first lower intermediate electrode LIEa. The width Wb6 of the protruding portion LIEb2 of the second lower intermediate electrode LIEb in the first direction X may increase toward the buried portion LIEb1 of the second lower intermediate electrode LIEb.

FIGS. 9A through 9H are cross-sectional views for describing a method of manufacturing a semiconductor device, according to some embodiments.

Figure 9A:
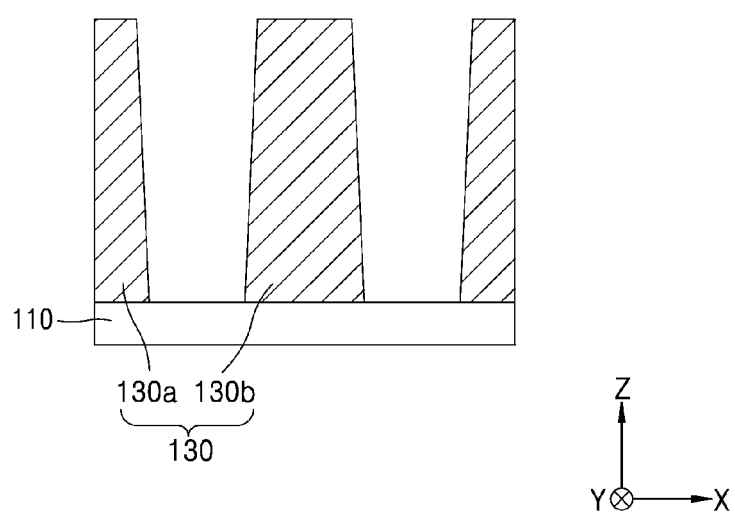
FIGS. 9A through 9H are cross-sectional views for describing a method of manufacturing a semiconductor device, according to some embodiments.

Referring to FIG. 9A, the plurality of lower conductive lines 110 and the first interlayer insulating patterns 120 (see FIG. 9C) are formed on a substrate (not shown). The plurality of lower insulating patterns 130 extending in the second direction Y may be formed on the plurality of lower conductive lines 110 and the first interlayer insulating patterns 120 (see FIG. 9C).

Figure 9B:
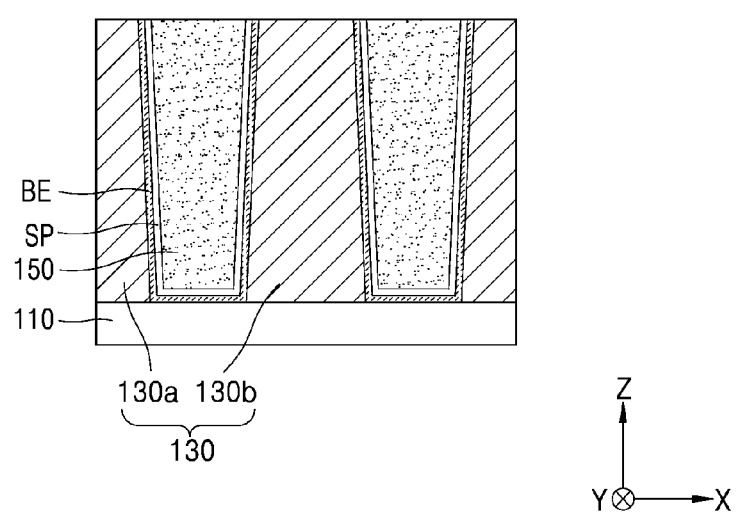

Referring to FIG. 9B, the lower electrode BE, the spacer SP, and the filling insulating pattern 150 are formed on the plurality of lower conductive lines 110, the first interlayer insulating patterns 120 (see FIG. 9C), and the plurality of lower insulating patterns 130. For example, after a lower electrode layer (not shown), a spacer layer (not shown), and a filling insulating layer (not shown) are sequentially formed on the lower insulating patterns 130, a chemical mechanical polishing (CMP) process or an etch-back process may be performed.

Figure 9C:
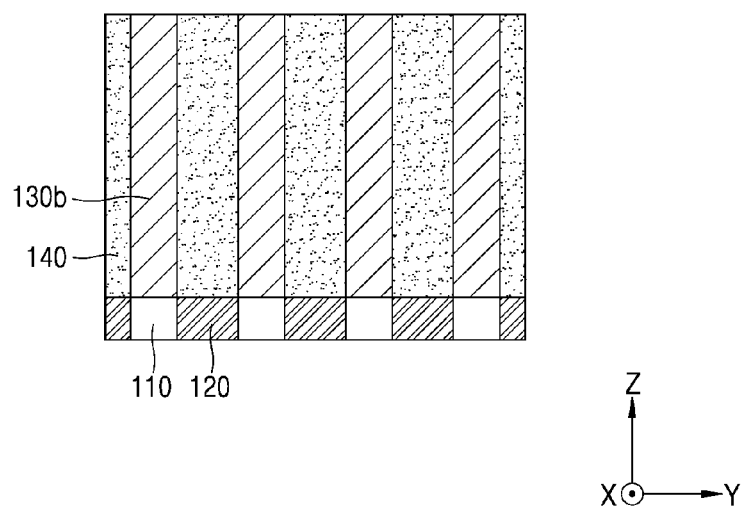

Referring to FIG. 9C, the second interlayer insulating patterns 140 extending in the first direction X and intersecting the lower insulating pattern 130 and the filling insulating pattern 150 (see FIG. 9B) are formed.

Figure 9D:
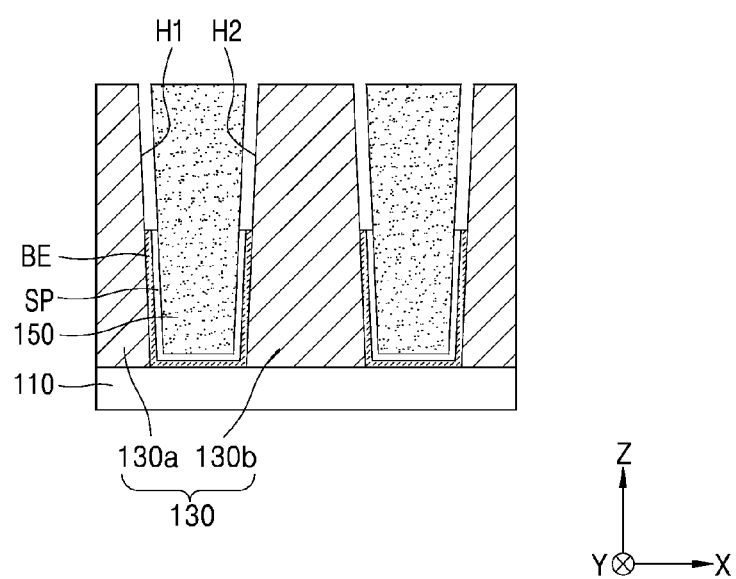

Referring to FIG. 9D, a first space H1 between the filling insulating pattern 150 and the first lower insulating pattern 130a and a second space H2 between the filling insulating pattern 150 and the second lower insulating pattern 130b are formed by etching an upper portion of the spacer SP and an upper portion of the lower electrode BE.

Figure 9E:
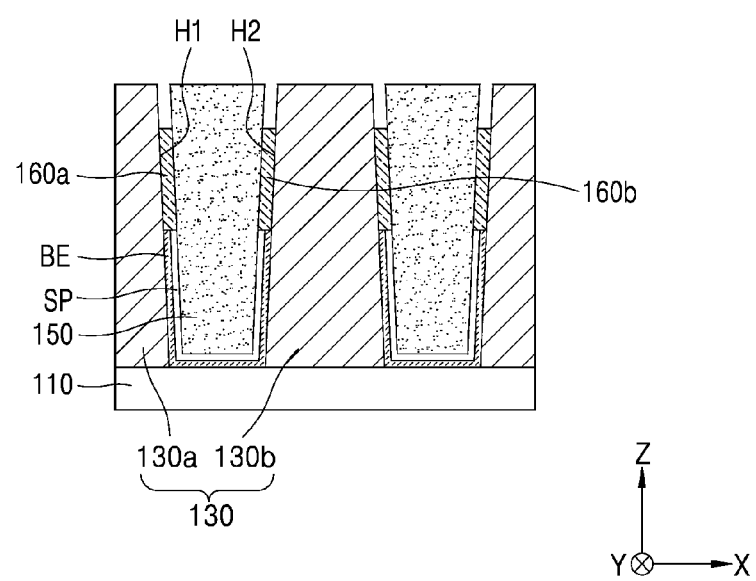

Referring to FIG. 9E, the first memory pattern 160a is formed in the first space H1 between the filling insulating pattern 150 and the first lower insulating pattern 130a, and the second memory pattern 160b is formed in the second space H2 between the filling insulating pattern 150 and the second lower insulating pattern 130b. For example, a memory layer (not shown) may be formed in the first space H1 and the second space H2, and a part of the memory layer may be removed by using etching.

Figure 9F:
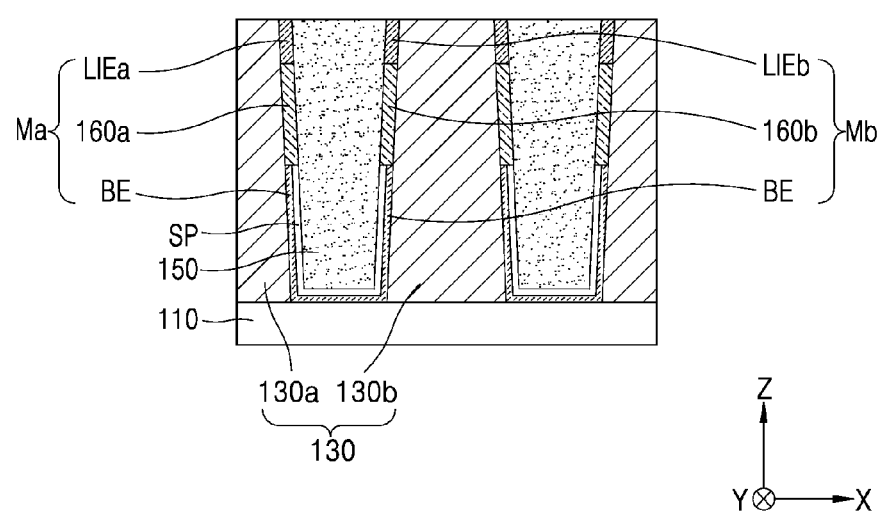

Referring to FIG. 9F, the first lower intermediate electrode LIEa is formed on the first memory pattern 160a, and the second lower intermediate electrode LIEb is formed on the second memory pattern 160b. For example, a lower intermediate electrode layer (not shown) may be formed on the first memory pattern 160a and the second memory pattern 160b, and the lower intermediate electrode layer may be polished by using a CMP process or may be etched by using an etch-back process until the first lower insulating pattern 130a, the second lower insulating pattern 130b, and the filling insulating pattern 150 are exposed. Accordingly, the first memory unit Ma and the second memory unit MB may be formed.

Figure 9G:
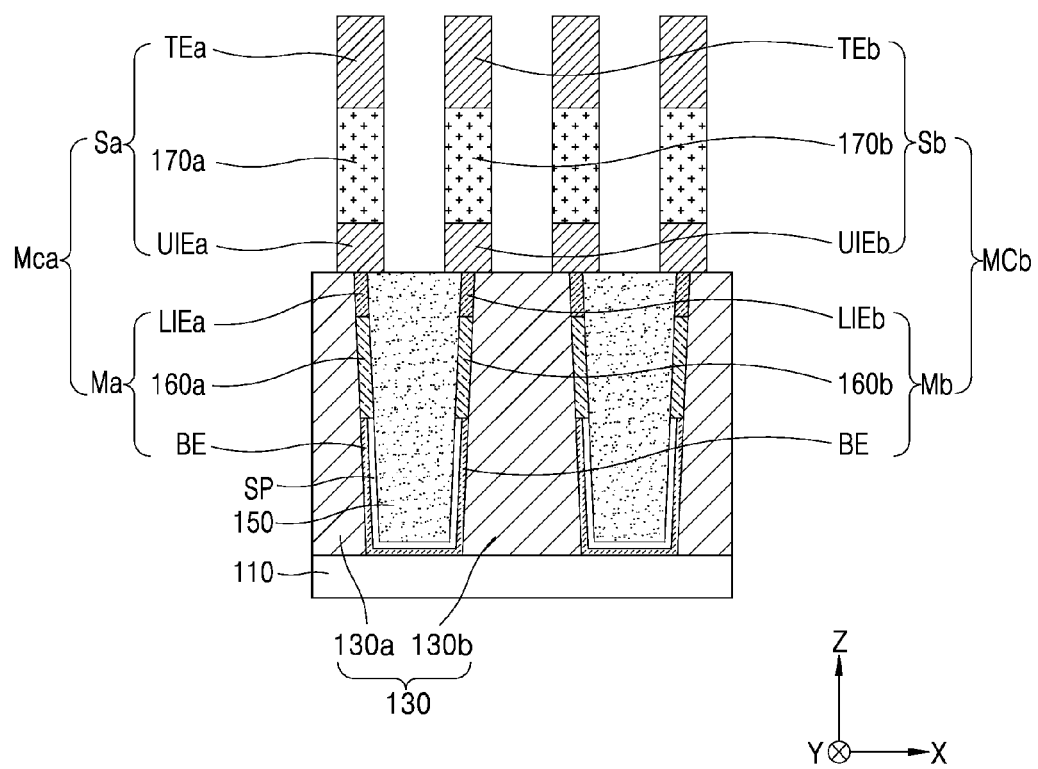
Figure 9H:
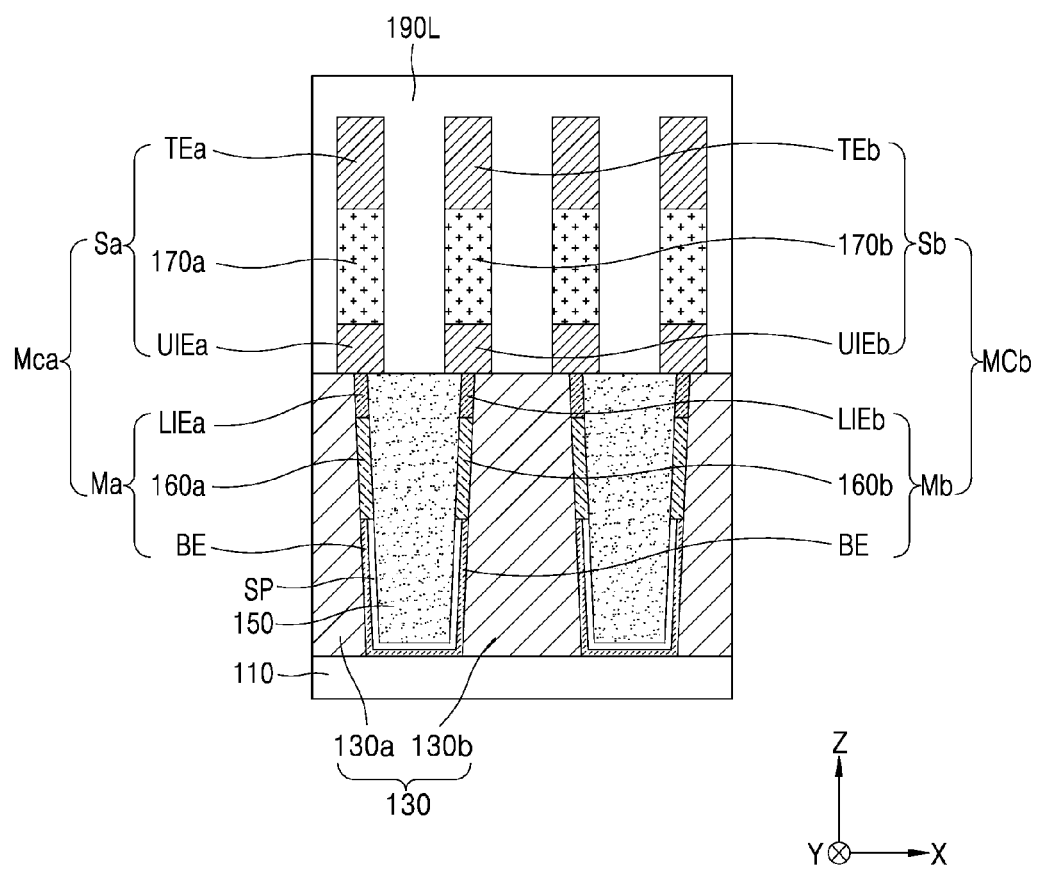

Referring to FIG. 9G, the first switch unit Sa may be formed on the first memory unit Ma, and the second switch unit Sb may be formed on the second memory unit Ma. For example, an upper intermediate electrode layer (not shown), a switch layer (not shown), and an upper electrode layer (not shown) may be sequentially formed on the first switch unit Sa, the second switch unit Sb, the first lower insulating pattern 130a, the second lower insulating pattern 130b, and the filling insulating pattern 150, and the first upper insulating pattern UIEa, the first switch pattern 170a, the first upper electrode TEa, the second upper insulating pattern UIEb, the second switch pattern 170b, and the second upper electrode TEb may be formed by patterning the upper intermediate electrode layer, the switch layer, and the upper electrode layer in the first direction X and the second direction Y.

Referring to FIG. 9H and FIGS. 2A through 3, an upper insulating layer 190L may be formed on the first switch unit Sa and the second switch unit Sb. The upper insulating layer 190L may be polished by using a CMP process or may be etched by using an etch-back process so that the protruding portion TEa2 of the first upper electrode TEa and the protruding portion TEb2 of the second upper electrode TEb protrude from the upper insulating pattern 190. Accordingly, the upper insulating pattern 190 may be formed. Next, the first upper conductive line 180a may be formed on the first upper electrode TEa and the second upper conductive line 180b may be formed on the second upper electrode TEb. Accordingly, the memory device 100a of FIGS. 2A and 2B or the memory device 100b of FIG. 3 may be completed.

Referring to FIG. 9H and FIGS. 4A through 5B, when a part of the protruding portion TEa2 of the first upper electrode TEa and a part of the protruding portion TEb2 of the second upper electrode TEb are polished or etched during the polishing or etching of the upper insulating layer 190L, the memory device 100c of FIGS. 4A and 4B or the memory device 100d of FIGS. 5A and 5B may be manufactured.

FIGS. 10A through 10D are cross-sectional views for describing a method of manufacturing a semiconductor device, according to some embodiments.

Figure 10A:
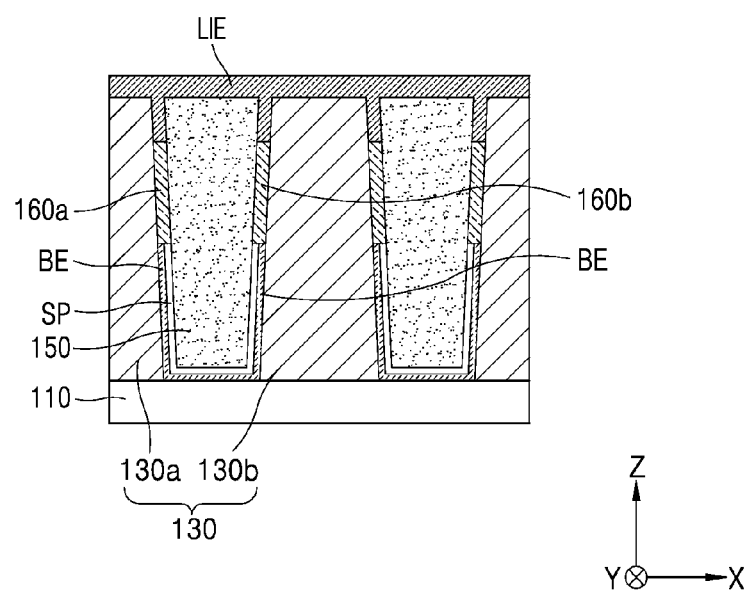
FIGS. 10A through 10D are cross-sectional views for describing a method of manufacturing a semiconductor device, according to some embodiments.

Referring to FIG. 10A, a process of FIG. 10A may be performed after processes of FIGS. 9A through 9E are performed. A lower intermediate electrode layer LIE may be formed on the first memory pattern 160a and the second memory pattern 160b.

Figure 10B:
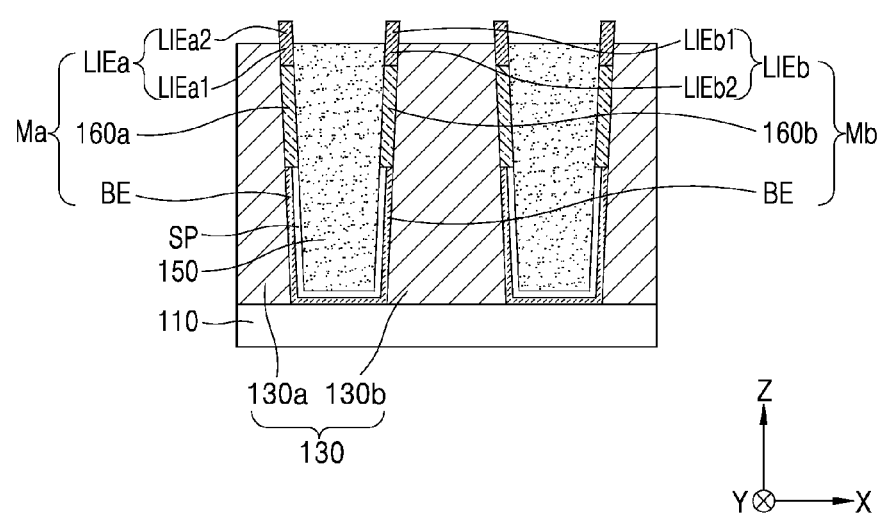

Referring to FIGS. 10A and 10B, the lower intermediate electrode layer LIE may be polished or etched. Not only the lower intermediate electrode layer LIE but also an upper portion of the first lower insulating pattern 130a, an upper portion of the second lower insulating pattern 130b, and an upper portion of the filling insulating pattern 150 may be polished or etched by the polishing or etching. Accordingly, the protruding portion LIEa2 of the first lower intermediate electrode LIEa and the protruding portion LIEb2 of the second lower intermediate electrode LIEb may protrude.

Figure 10C:
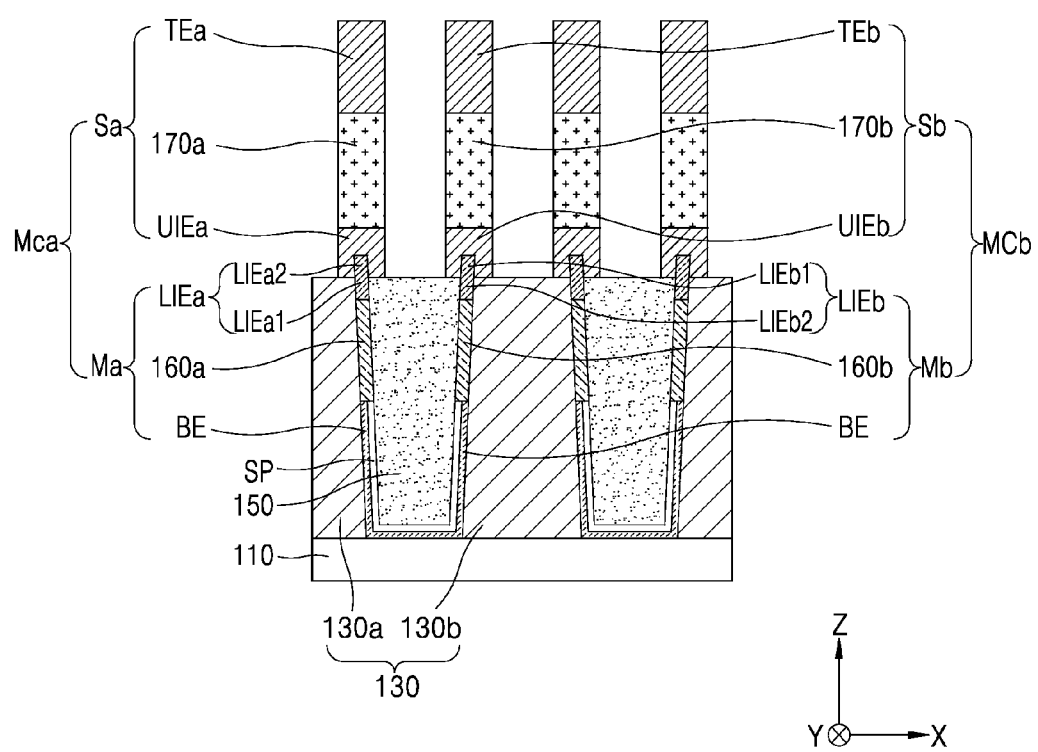

Referring to FIG. 10C, the first switch unit Sa may be formed on the first memory unit Ma, and the second switch unit Sb may be formed on the second memory unit Mb. A detailed explanation is the same as that made with reference to FIG. 9G.

Figure 10D:
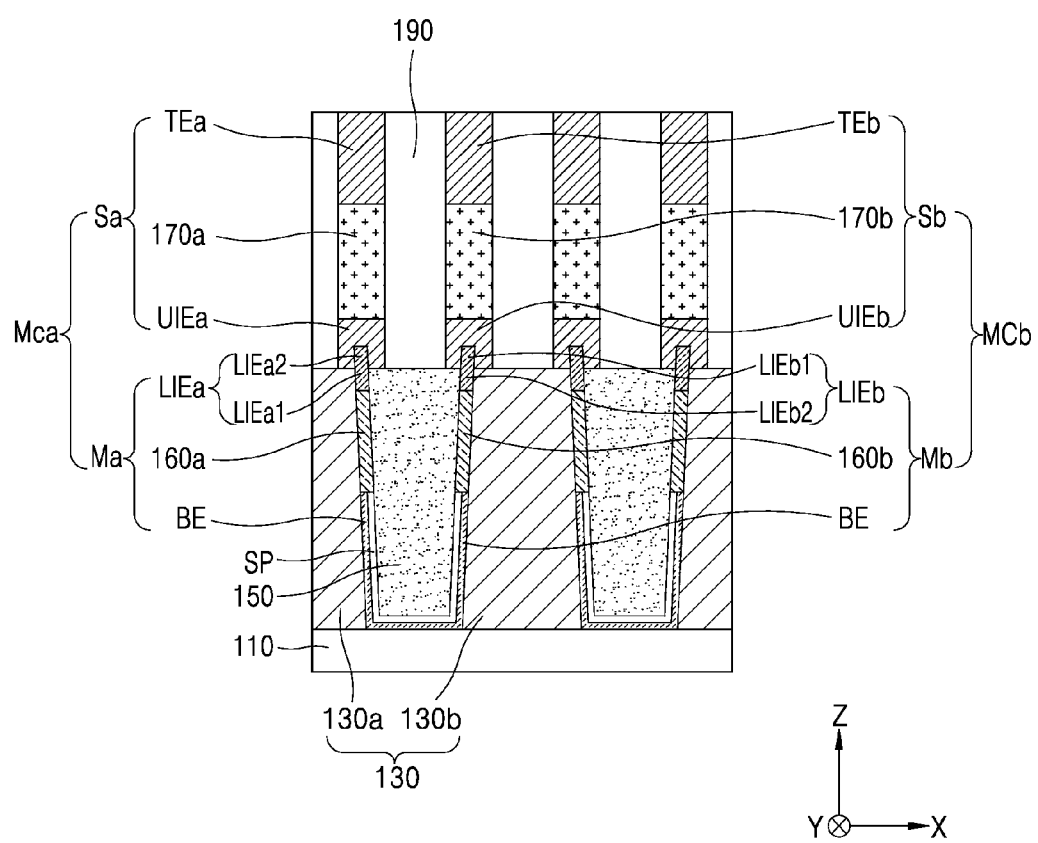

Referring to FIG. 10D, the upper insulating pattern 190 surrounding the first switch unit Sa and the second switch unit Sb may be formed.

Referring to FIG. 6A, the first upper conductive line 180a may be formed on the first switch Sa, and the second upper conductive line 180b may be formed on the second switch unit Sb. Accordingly, the memory device 100e of FIG. 6A may be completed.

In the step of FIG. 10B, when the upper portion of the first lower insulating pattern 130a, the upper portion of the second lower insulating pattern 130b, and the upper portion of the filling insulating pattern 150 are polished or etched, a part of the protruding portion LIEa2 of the first lower intermediate electrode LIEa and a part of the protruding portion LIEb2 of the second lower intermediate electrode LIEb may also be polished or etched. In this case, the memory device 100f of FIGS. 7A and 7B or the memory device 100g of FIGS. 8A and 8B may be manufactured.

While the inventive concept has been particularly shown and described with reference to embodiments thereof by using specific terms, the embodiments should be considered in a descriptive sense only and not for purposes of limitation. Therefore, the scope of the inventive concept is defined not by the detailed description of the inventive concept but by the appended claims, and all differences within the scope will be construed as being included in the inventive concept.

What is claimed is:

1. A memory device comprising:
   a lower conductive line;
   a first memory unit and a second memory unit sharing a shared lower electrode, the shared lower electrode comprising first and second portions electrically connecting respective ones of the first memory unit and the second memory unit to the lower conductive line;
   a filling insulating pattern between the first and second memory units;
   an upper insulating pattern on the filling insulating pattern;
   a first switch unit on the first memory unit in the upper insulating pattern and comprising an upper electrode with a portion protruding from the upper insulating pattern;
   a second switch unit on the second memory unit in the upper insulating pattern and comprising an upper electrode with a portion protruding from the upper insulating pattern;
   a first upper conductive line contacting the protruding portion of the upper electrode of the first switch unit; and
   a second upper conductive line contacting the protruding portion of the upper electrode of the second switch unit.

2. The memory device of claim 1, wherein the first upper conductive line contacts a pair of side surfaces of the protruding portion of the upper electrode of the first switch unit and wherein the second conductive line contacts a pair of side surfaces of the protruding portion of the upper electrode of the second switch unit.

3. The memory device of claim 2, wherein the first upper conductive line contacts four side surfaces of the protruding portion of the upper electrode of the first switch unit and wherein the second upper conductive line contacts four side surfaces of the protruding portion of the upper electrode of the second switch unit.

4. The memory device of claim 1, wherein a width of the first upper conductive line is greater than a width of the protruding portion of the upper electrode of the first switch unit and wherein a width of the second upper conductive line is greater than a width of the protruding portion of the upper electrode of the second switch unit.

5. The memory device of claim 1, wherein a width of the protruding portion of the upper electrode of the first switch unit is less than a width of a portion of the upper electrode of the first switch unit buried in the upper insulating pattern and wherein a width of the protruding portion of the upper electrode of the second switch unit is less than a width of a portion of the upper electrode of the second switch unit buried in the upper insulating pattern.

6. The memory device of claim 1, wherein a width of the protruding portion of the upper electrode of the first switch unit increases toward a portion of the upper electrode of the first switch unit buried in the upper insulating pattern and wherein a width of the protruding portion of the upper electrode of the second switch unit increases toward a portion of the upper electrode of the second switch unit buried in the upper insulating pattern.

7. The memory device of claim 1, wherein the shared lower electrode further comprises a third portion contacting the lower conductive line and wherein the first and second portions of the shared lower electrode extend from respective first and second ends of the third portion of the shared lower electrode.

8. The memory device of claim 1, wherein the filling insulating pattern is located between a first and second lower insulating patterns.

9. The memory device of claim 8:
wherein the first memory unit comprises:
a first memory pattern between the first lower insulating pattern and the filling insulating pattern; and
a first lower intermediate electrode between the first memory pattern and the first switch unit; and
wherein the second memory unit comprises:
a second memory pattern between the second lower insulating pattern and the filling insulating pattern; and
a second lower intermediate electrode between the second memory pattern and the second switch unit.

10. The memory device of claim 9, wherein a side surface of the first lower insulating pattern and a side surface of the second lower insulating pattern are inclined with respect to a direction perpendicular to a direction in which the lower conductive line extends.

11. A memory device comprising:
a lower conductive line;
a lower electrode comprising a first portion on the lower conductive line and second and third portions extending from respective first and second ends of the first portion of the lower electrode;
a first memory pattern on an end of the second portion of the lower electrode;
a second memory pattern on an end of the third portion of the lower electrode;
a first lower intermediate electrode on the first memory pattern;
a second lower intermediate electrode on the second memory pattern;
a filling insulating pattern between the second and third portions of the lower electrode and between the first and second memory patterns;
a first upper intermediate electrode, a first switch pattern, and a first upper electrode stacked on the first lower intermediate electrode;
a second upper intermediate electrode, a second switch pattern, and a second upper electrode stacked on the second lower intermediate electrode;
upper insulating pattern on the filling insulating pattern and surrounding the first upper intermediate electrode, the first switch pattern, the first upper electrode, the second upper intermediate electrode, the second switch pattern, and the second upper electrode;
a first upper conductive line contacting the first upper electrode; and
a second upper conductive line contacting the second upper electrode, wherein the first lower intermediate electrode comprises a portion protruding into the first upper intermediate electrode, and
wherein the second lower intermediate electrode comprises a portion protruding into the second upper intermediate electrode.

12. The memory device of claim 11, wherein the protruding portion of the first lower intermediate electrode is surrounded by the first upper intermediate electrode and wherein the protruding portion of the second lower intermediate electrode is surrounded by the second upper intermediate electrode.

13. The memory device of claim 11, wherein a width of the first upper intermediate electrode is greater than a width of the protruding portion of the first lower intermediate electrode and wherein a width of the second upper intermediate electrode is greater than a width of the protruding portion of the second lower intermediate electrode.

14. The memory device of claim 11, wherein a width of the first upper intermediate electrode is greater than a width of a portion of the first lower intermediate electrode below the first upper intermediate electrode and wherein a width of the second upper intermediate electrode is greater than a width of the second lower intermediate electrode below the second upper intermediate electrode.

15. The memory device of claim 11, wherein a width of the first lower intermediate electrode below the first upper intermediate electrode is greater than a width of the protruding portion of the first lower intermediate electrode and wherein a width of the second lower intermediate electrode below the second upper intermediate electrode is greater than a width of the protruding portion of the second lower intermediate electrode.

16. The memory device of claim 11, wherein a width of the protruding portion of the first lower intermediate electrode increases toward the first memory pattern and wherein a width of the protruding portion of the second lower intermediate electrode increases toward the second memory pattern.

17. The memory device of claim 11, wherein portions of the first lower intermediate electrode and the second lower intermediate electrode below the first and second upper intermediate electrodes are inclined with respect to a direction perpendicular to a direction in which the lower conductive line extends.

18. The memory device of claim 11, wherein the protruding portions of the first and second lower intermediate electrodes are inclined with respect to a direction perpendicular to a direction in which the lower conductive line extends.

19. The memory device of claim 11, wherein at least a part of the first upper electrode and at least a part of the second upper electrode protrude from the upper insulating pattern.

20. A memory device comprising:
a lower conductive line extending in a first direction;
a first lower insulating pattern and a second lower insulating pattern on the lower conductive line and spaced apart from each other in the first direction;
a filling insulating pattern between the first lower insulating pattern and the second lower insulating pattern;
a lower electrode comprising a first portion between the lower conductive line and the filling insulating pattern, a second portion between the first lower insulating pattern and the filling insulating pattern, and a third portion between the second lower insulating pattern and the filling insulating pattern;

a spacer between the lower electrode and the filling insulating pattern;

a first memory pattern on an end of the lower electrode and an end of the spacer and extending along the first lower insulating pattern;

a second memory pattern on the other end of the lower electrode and the other end of the spacer and extending along the second lower insulating pattern;

a first lower intermediate electrode on the first memory pattern and extending along the first lower insulating pattern;

a second lower intermediate electrode on the second memory pattern and extending along the second lower insulating pattern;

a first upper intermediate electrode, a first switch pattern and a first upper electrode sequentially stacked on the first lower intermediate electrode;

a second upper intermediate electrode, a second switch pattern, and a second upper electrode sequentially stacked on the second lower intermediate electrode;

an upper insulating pattern on the first lower insulating pattern and the second lower insulating pattern and surrounding the first upper intermediate electrode, the first switch pattern, the first upper electrode, the second upper intermediate electrode, the second switch pattern, and the second upper electrode;

a first upper conductive line contacting the first upper electrode and extending in a second direction; and a second upper conductive line contacting the second upper electrode and extending in the second direction, wherein each of the first upper electrode and the second upper electrode comprises a buried portion surrounded by the upper insulating pattern and a protruding portion protruding from the upper insulating pattern.

\* \* \* \* \*